United States Patent
Yamashita

(10) Patent No.: US 8,064,262 B2
(45) Date of Patent: Nov. 22, 2011

(54) SEMICONDUCTOR DEVICE AND METHOD USING STRESS INFORMATION

(75) Inventor: Minoru Yamashita, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 279 days.

(21) Appl. No.: 12/233,577

(22) Filed: Sep. 18, 2008

(65) Prior Publication Data

US 2009/0251970 A1  Oct. 8, 2009

(30) Foreign Application Priority Data

Sep. 18, 2007  (JP) .................................. 2007-241065

(51) Int. Cl.
*G11C 16/06*  (2006.01)

(52) U.S. Cl. ............. 365/185.2; 365/185.22; 365/210.1; 365/210.11

(58) Field of Classification Search ............. 365/185.24, 365/185.2, 185.02, 210.1, 210.11
See application file for complete search history.

(56) References Cited

U.S. PATENT DOCUMENTS

| | | | | |
|---|---|---|---|---|
| 5,163,021 A * | 11/1992 | Mehrotra et al. | ........ | 365/185.03 |
| 6,266,276 B1 * | 7/2001 | Odani | ...................... | 365/185.18 |
| 6,278,633 B1 * | 8/2001 | Wong et al. | ............... | 365/185.03 |
| 6,597,606 B2 * | 7/2003 | Tedrow | ..................... | 365/185.28 |
| 6,639,849 B2 * | 10/2003 | Takahashi et al. | ........ | 365/185.03 |
| 6,906,951 B2 * | 6/2005 | Wong | ........................ | 365/185.03 |
| 7,800,946 B2 * | 9/2010 | Kim et al. | ................ | 365/185.11 |

FOREIGN PATENT DOCUMENTS

| | | |
|---|---|---|
| JP | 2000-348491 | 12/2000 |
| JP | 2003-346482 | 12/2003 |

* cited by examiner

*Primary Examiner* — Anh Phung
*Assistant Examiner* — Lance Reidlinger

(57) ABSTRACT

A semiconductor device in accordance with one embodiment of the invention can include a first data storage region including a non-volatile main data storage region. Additionally, the semiconductor device can include a second data storage region including a non-volatile reference region wherein an erasing operation and a writing operation are performed on both the first data storage region and the second data storage region. Moreover, the semiconductor device can also include a control unit coupled to the first and second data storage regions which determines a stress condition corresponding to the first data storage region based on a stress information related to the second data storage region.

20 Claims, 8 Drawing Sheets

SEMICONDUCTOR DEVICE AND METHOD USING STRESS INFORMATION

CROSS-REFERENCE TO RELATED APPLICATIONS

This patent application claims the benefit and priority of the co-pending Japanese Patent Application No. 2007-241065, filed on Sep. 18, 2007, which is hereby incorporated by reference in its entirety.

BACKGROUND

A non-volatile memory such as a flash memory includes a data storage region formed of a plurality of memory cells. The memory cell has a transistor structure including a charge storage layer, and changes the threshold voltage of the memory cell by making the amount of the charge in the charge storage layer variable to store the data.

The charge is implanted into the charge storage layer or is withdrawn there from by applying a predetermined stress to respective terminals of the gate/source/drain of the memory cell transistor. When the data are written into the memory cell, the stress application and the verification operation are repeatedly performed to increase the threshold voltage step-wise for the purpose of preventing the over-programming to the memory cell.

However, as the data rewriting frequency is increased, the charge implantation to the charge storage layer becomes difficult owing to deterioration in the memory cell, and accordingly, the time for writing data becomes longer.

SUMMARY

One embodiment in accordance with the invention can include a semiconductor device having a mechanism for adjusting the stress applied to a memory cell upon data writing in accordance with the condition of the memory cell, which is capable of reducing time for data writing. An embodiment in accordance with the invention can include a method for controlling the semiconductor device.

A semiconductor device in accordance with one embodiment of the invention can include a first data storage region including a non-volatile main data storage region. Additionally, the semiconductor device can include a second data storage region including a non-volatile reference region wherein an erasing operation and a writing operation are performed on both the first data storage region and the second data storage region. Moreover, the semiconductor device can also include a control unit coupled to the first and second data storage regions which determines a stress condition corresponding to the first data storage region based on a stress information related to the second data storage region.

An embodiment in accordance with the invention can include a method for controlling a semiconductor device which includes a first data storage region including a main data storage region and a second data storage region including a reference region. The method can include erasing data stored in the first and the second data storage regions at substantially the same time. In addition, the method can include writing data to the second data storage region. Also, the method can include determining a stress condition corresponding to the first data storage region based on a stress information related to the second data storage region.

A flash memory in accordance with one embodiment of the invention can include a first data storage region that includes a non-volatile main data storage region. The flash memory can include a second data storage region including a non-volatile reference region wherein an erasing operation and a writing operation are performed on both the first data storage region and the second data storage region. A control unit of the flash memory can be coupled to the first and second data storage regions which determines a stress condition corresponding to the first data storage region based on a stress information related to the second data storage region. The stress information can include a frequency of the stress applied to the second data storage region.

While particular embodiments in accordance with the invention have been specifically described within this Summary, it is noted that the invention is not limited to these embodiments. The invention is intended to cover alternatives, modifications and equivalents which may be included within the scope of the invention as recited by the Claims.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
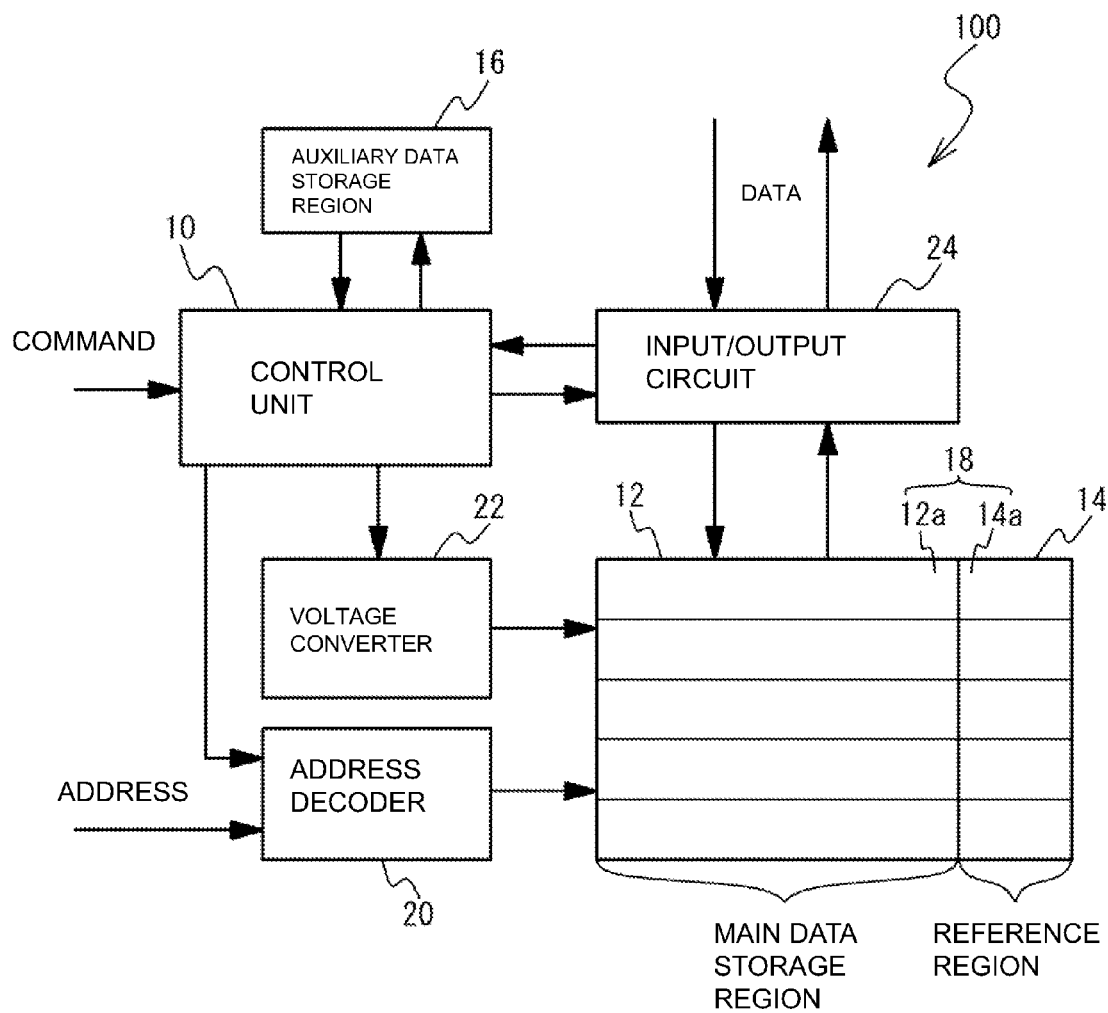
FIG. 1 is a block diagram showing the structure of a semiconductor device in accordance with various embodiments of the invention.

FIG. 1 is a block diagram showing the structure of a semiconductor device 100 in accordance with various embodiments of the invention. Semiconductor device 100 can be implemented in a wide variety of ways. For example, in one embodiment, the semiconductor device 100 can be an electrically erasable and writable semiconductor device such as flash memory, but is not limited to such.

The semiconductor device 100 includes a control unit 10, a main data storage region 12 as a first data storage region, a reference region 14 as a second data storage region, an auxiliary data storage region 16 as a third data storage region, an address decoder 20, a voltage converter 22, and an input/output circuit 24.

The control unit 10 controls operations of the address decoder 20, the voltage converter 22, and the input/output circuit 24 so as to control a data writing operation, a data reading operation, and a data erasing operation with respect to the main data storage region 12 and the reference region 14. Information related to stress is communicated between the control unit 10 and the auxiliary data storage region 16, which is described later.

The main data storage region 12 includes a plurality of non-volatile memory cells to store various programs and data in accordance with the usage. The reference region 14 also includes a plurality of non-volatile memory cells similar to the main data storage region 12 to store the reference information which is referred to when reading data from the main data storage region 12. Each of the main data storage region 12 and the reference region 14 is divided into a plurality of sectors (for example, 12a and 14a) such that the data erasing operation is performed by the unit of the sector.

Figure 2:
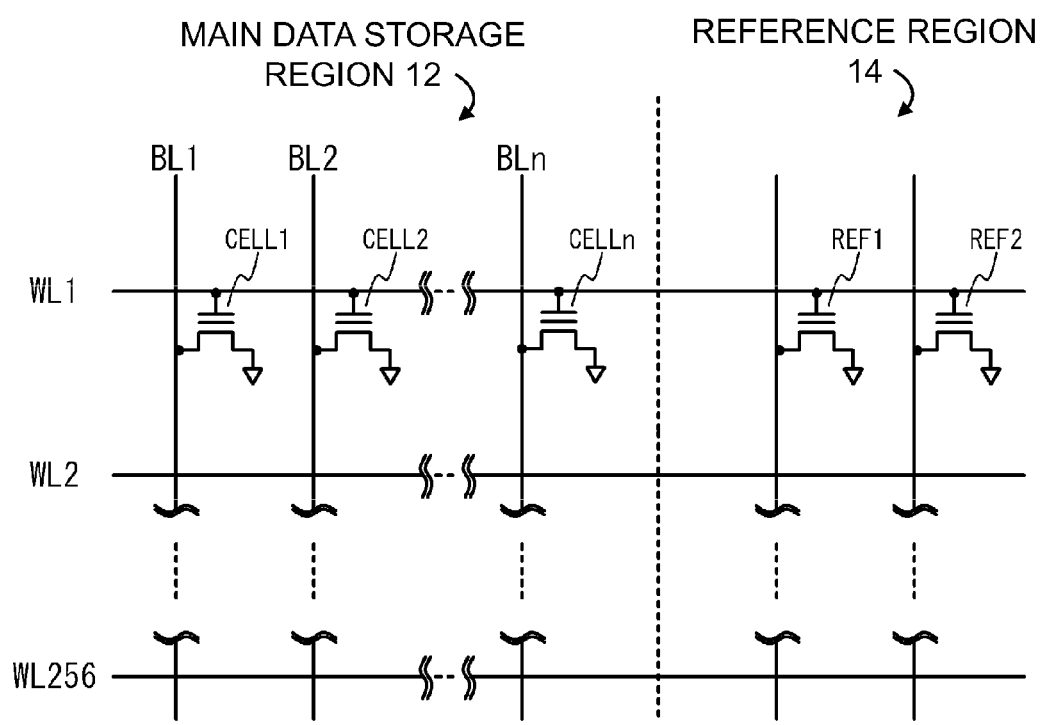
FIG. 2 is a circuit diagram of a partially enlarged memory cell array shown in FIG. 1, in accordance with various embodiments of the invention.

FIG. 2 is a circuit diagram having the main data storage region 12 and the reference region 14 partially enlarged, in accordance with various embodiments of the invention. Memory cells CELL1 to CELLn as portions of the main data storage region 12 are disposed at the regions where a word line WL1 intersects with bit lines BL1 to BLn. Memory cells REF 1 and REF 2 as portions of the reference region 14 are disposed on the word line WL1. The respective sectors of the main data storage region 12 and the reference region 14 are formed of a plurality of word lines (for example, 256 lines).

Within one embodiment, the memory cell REF 1 stores a logical value of "0", and has the threshold voltage of the memory cell set to a high level of $V_H$. Meanwhile, the memory cell REF 2 stores a logical value of "1", and has the threshold voltage set to a low level of $V_L$. A reference voltage $V_{REF}$ as the intermediate value between those values of $V_H$ and $V_L$ is determined. Upon the data reading operation, the reference voltage $V_{REF}$ is compared with the respective threshold voltages of the memory cells CELL1 to CELLn of the main data storage region 12. When the read threshold voltage is higher than the reference voltage $V_{REF}$, the logical value of "0" is read, and when it is lower than the reference voltage $V_{REF}$, the logical value of "1" is read.

The non-volatile memory cell will gradually deteriorate as the data writing and data erasing operations are repeatedly performed, and accordingly, the amount of change in the threshold voltage of the memory cell with respect to the same stress may change in accordance with the deterioration in the memory cell. Accordingly, the data reading operation can be stably performed by referring to the reference region 14 when data is read from the main data storage region 12. In the reference region 14, the data erasing operation is performed by the same unit as in the main data storage region 12. So the data erasing operation is performed the same number of times as in the main data storage region 12. This makes it possible to make the condition of the memory cell of the reference region 14 (for example, the deterioration level of the memory cell) equal to that of the main data storage region 12. As a result, the stress condition when data is written to the main data storage region 12 can be determined based on the stress information when data is written to the reference region 14, which will be described later. After data has been erased, the data writing to the reference region 14 is performed before the data writing to the main data storage region 12.

The auxiliary data storage region 16 shown in FIG. 1 stores the stress information for the data writing operation to the reference region 14 and the stress information for the data writing operation to the main data storage region 12 so that they are correlated with each other. The stress information corresponds to the condition of the memory cell of the reference region 14, and includes the amount of change in the threshold voltage of the memory cell, for example, when a predetermined stress is applied, and the frequency of the stress applied to the memory cell upon data writing. The stress condition corresponds to the stress applied to the memory cell of the main data storage region 12 upon data writing, and includes the level of the data writing voltage and the length of the time for which the voltage is applied.

In an embodiment, the address decoder 20 selects the memory cell having the data subjected to the data writing and the data reading operations in accordance with an address signal and a control signal input from the control unit 10. The voltage converter 22 generates a high voltage or a voltage greater than a defined or predefined voltage value for performing the data writing, data reading and data erasing operations, in response to the control signal input from the control unit 10. The input/output circuit 24 communicates data with the control unit 10, the main data storage region 12 and an outside device (not shown).

Figure 3:
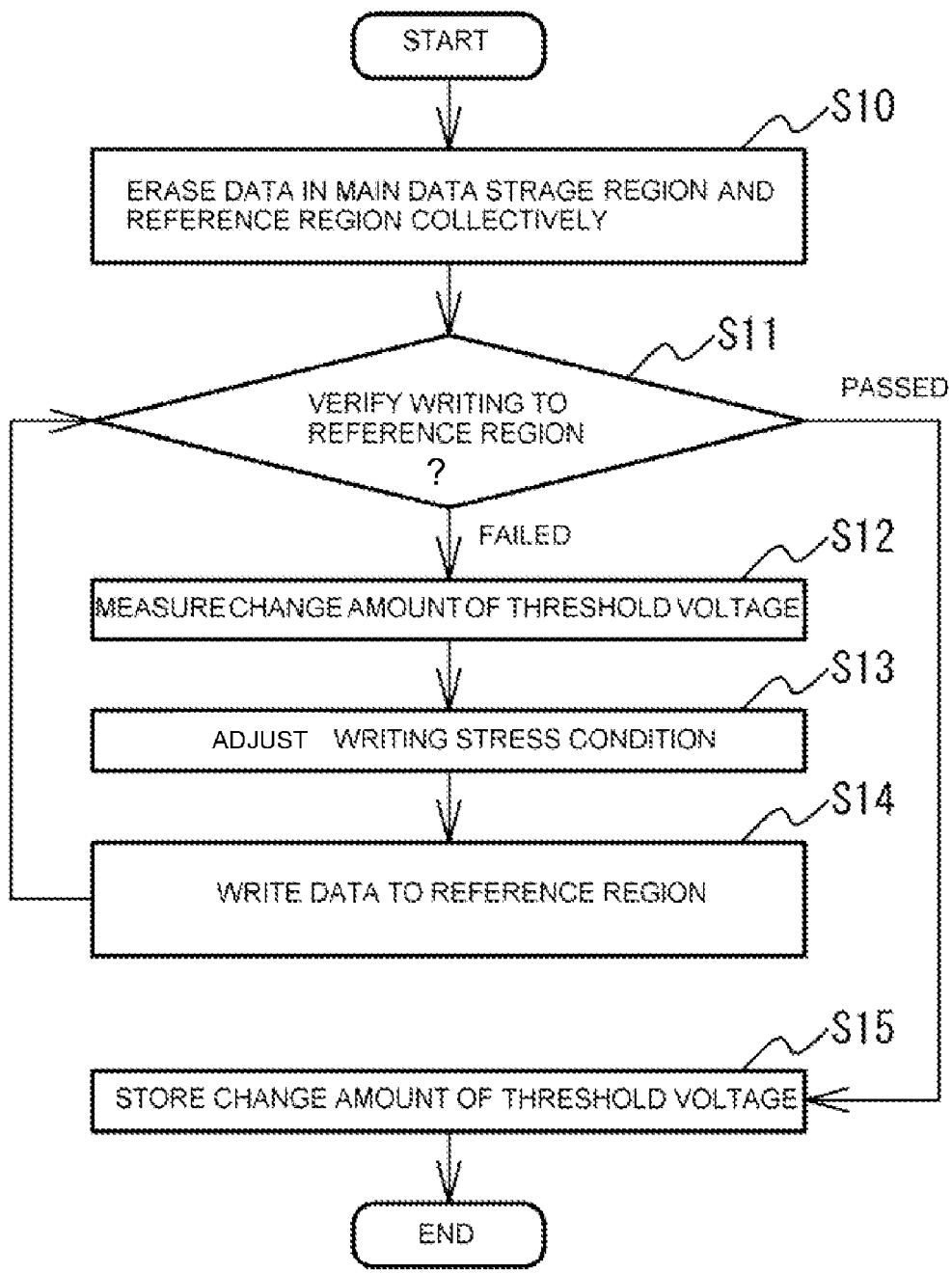
FIG. 3 is a flow diagram showing the operation of a semiconductor device in accordance with various embodiments of the invention.
Figure 4:
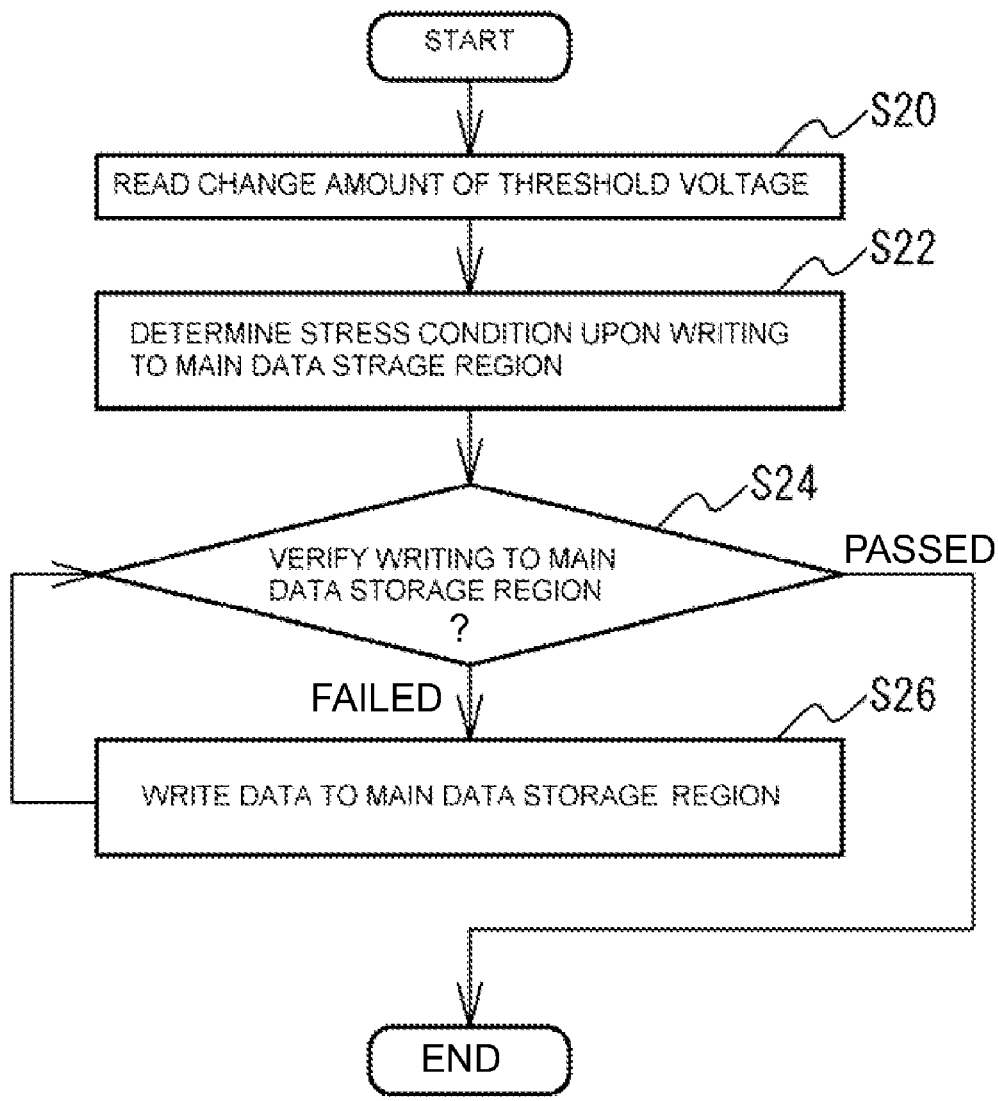
FIG. 4 is another flow diagram showing the operation of a semiconductor device in accordance with various embodiments of the invention.

Referring to FIGS. 3 and 4, the operation of the semiconductor device 100 according to various embodiments will be described. FIG. 3 is a flow diagram of a method in accordance with various embodiments of the invention. The flow diagram includes exemplary processes of embodiments of the invention. Although specific operations are disclosed in FIG. 3, such operations are exemplary. That is, the method may not include all of the operations illustrated by FIG. 3. Also, the method may include various other operations and/or variations of the operations shown by FIG. 3. Likewise, the sequence of the operations of the method may be modified.

FIG. 3 is a flow diagram showing the control routine for the data erasing operation in the semiconductor device 100 in accordance with various embodiments of the invention. At block S10, the control unit 10 erases the data stored in the main data storage region 12 and the reference region 14. The data erasing operation is performed by the unit of the sector including a plurality of memory cells. For example, the data stored in a block 18 (FIG. 1) formed of a sector 12a of the main data storage region 12 and a sector 14a of the corresponding reference region are erased collectively. At this time, in order to make the condition with respect to the stress applied to the respective memory cells in the sector uniform, it can be desirable to perform the data erasing operation after writing data to the memory cell to be erased, in which no data are written.

At block S11 of FIG. 3, the control unit 10 verifies the threshold voltage of the reference region 14. In one embodiment, the threshold voltage of the reference region 14 is gradually increased. When the threshold voltage exceeds a predetermined threshold voltage, the data writing passes the verification, that is, the data writing operation is completed. If it fails, the control unit 10 measures the amount of change in the threshold voltage of the reference region 14 at block S12, and adjusts the writing stress condition (e.g., voltage level, length of the time for applying voltage) if needed at block S13. At block S14, the control unit 10 performs the data writing to the reference region 14. It is noted that the process from blocks S12 to S14 can be repeatedly performed until the data writing passes the verification at block S11.

When the data writing passes the verification at block S11, the control unit 10 stores as the stress information the amount of change in the threshold voltage of the reference region 14 caused by the stress in the auxiliary data storage region 16 at block S15. Thus, the data erasing operation in the semiconductor device 100 can end.

FIG. 4 is a flow diagram of a method in accordance with various embodiments of the invention. The flow diagram includes exemplary processes of embodiments of the invention. Although specific operations are disclosed in FIG. 4, such operations are exemplary. That is, the method may not include all of the operations illustrated by FIG. 4. Also, the method may include various other operations and/or variations of the operations shown by FIG. 4. Likewise, the sequence of the operations of the method may be modified. Specifically, FIG. 4 is a flow diagram showing the routine for controlling the data writing operation to the main data storage region 12 in the semiconductor device 100 in accordance with various embodiments of the invention. At block S20, the control unit 10 reads the amount of change in the threshold voltage of the reference region 14 stored at block S15 of FIG. 3 from the auxiliary data storage region 16. At block S22, the control unit 10 sets the stress condition when data is written to the main data storage region 12 based on the amount of change in the thus read threshold voltage. The process for setting the stress condition will be described in detail later.

At block S24, the control unit 10 verifies the threshold voltage of the main data storage region 12. Similar to the data writing operation to the reference region 14, the threshold voltage of the main data storage region 12 is gradually increased. When the threshold voltage exceeds the predetermined value, the data writing passes the verification. If it fails, the control unit 10 performs the data writing operation to the main data storage region 12 at block S26. The data writing operation to the main data storage region 12 is performed using the stress condition set at block S22.

It is noted that the data writing operation at block S26 is repeatedly performed until it passes the verification at block S24. The data writing operation can be performed in the same stress condition as the one set at block S22 without measuring the change amount of the threshold voltage and changing the stress condition. When the data writing passes the verification at block S24, the data writing operation can end.

The stress condition at block S22 of FIG. 4 is set based on the amount of change in the threshold voltage of the reference region 14 caused by the stress, which is stored in the auxiliary data storage region 16 at block S15 of FIG. 3. The process for setting the stress condition will be described hereinafter.

Figure 5A:
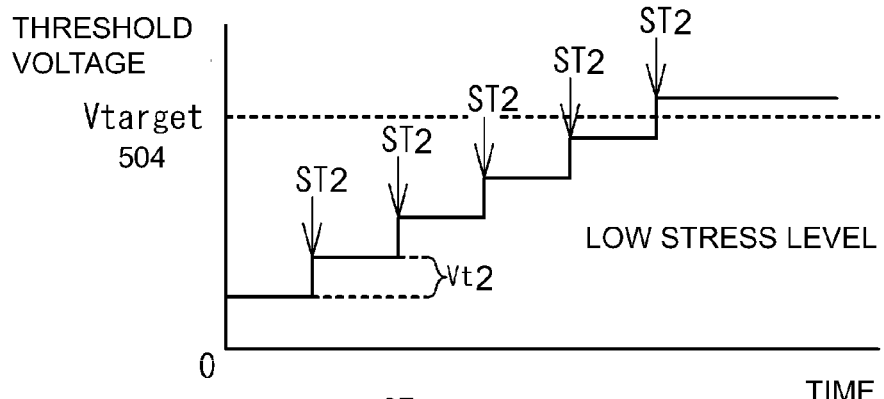
FIGS. 5A, 5B and 5C are graphs showing each change in the threshold voltage of a main data storage region and a reference region in a semiconductor device in accordance with various embodiments of the invention.
Figure 5B:
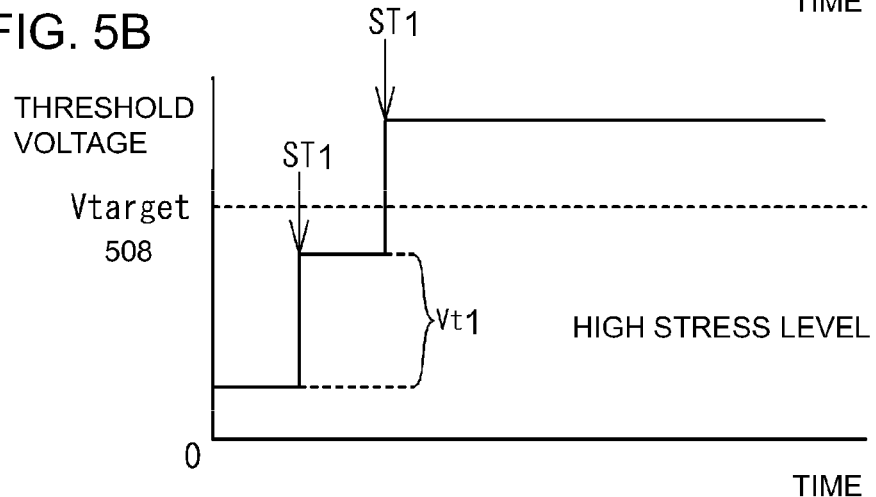
Figure 5C:
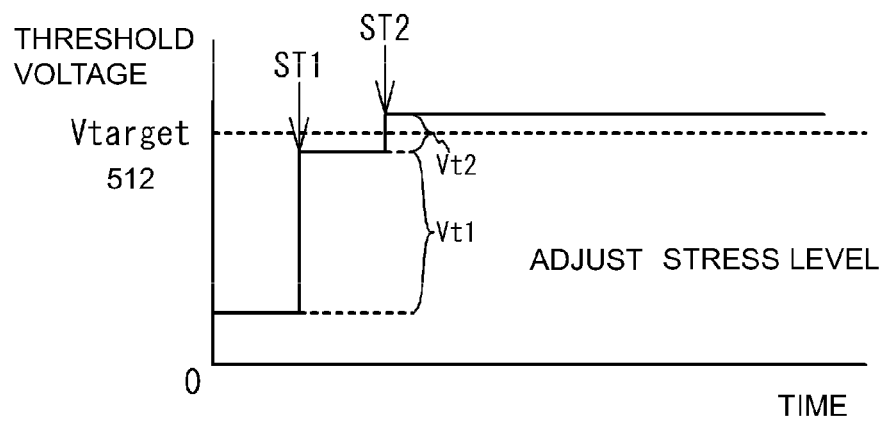

FIGS. 5A, 5B and 5C show each change in the threshold voltage of the reference region 14 with respect to the stress at the respective levels upon data writing, in accordance with various embodiments of the invention. Along with the increase in the stress (ST) applied to the memory cell, the threshold voltage can be gradually increased.

FIG. 5A is a graph showing the change in the threshold voltage under a low stress level (ST2) or less than a defined or predefined stress value in accordance with various embodiments of the invention. Since the change amount of the threshold voltage (Vt2) is small or less than a defined or predefined voltage value, application of stress (ST2) and verification can be repeated until the voltage exceeds the predetermined threshold voltage (Vtarget) 504, resulting in a longer time for data writing.

FIG. 5B is a graph showing the change in the threshold voltage under a high stress level (ST1) or greater than a defined or predefined stress value in accordance with various embodiments of the invention. Since the amount of change in the threshold voltage (Vt1) is large or greater than a defined or predefined voltage value, the time for data writing is reduced. However, the threshold voltage of the memory cell after the data writing may exceed the predetermined threshold value (Vtarget) 508 significantly, which may further widen the variation in the threshold voltage of the memory cell to which data has been written. This may cause a problem when the memory cell is multivalued.

FIG. 5C is a graph showing the change in the threshold voltage when the stress level is adjusted based on the change in the threshold voltage shown in FIGS. 5A and 5B, in accordance with various embodiments of the invention. The threshold voltage is increased at the large rate (Vt1) or a rate greater than a defined or predefined voltage value to reach the value in the vicinity of the target threshold voltage (Vtarget) 512 by the high stress ST1 or the stress greater than a defined or predefined stress value. Then, the threshold voltage is increased (Vt2) at the small rate or a rate less than a defined or predefined voltage value by the low stress ST2 or the stress less than a defined or predefined stress value. At the stage where the threshold voltage slightly exceeds the target threshold voltage Vtarget 512, the data writing operation is completed. The stress level is appropriately set to suppress the variation in the threshold voltage while reducing the time for the data writing operation.

Figure 6:
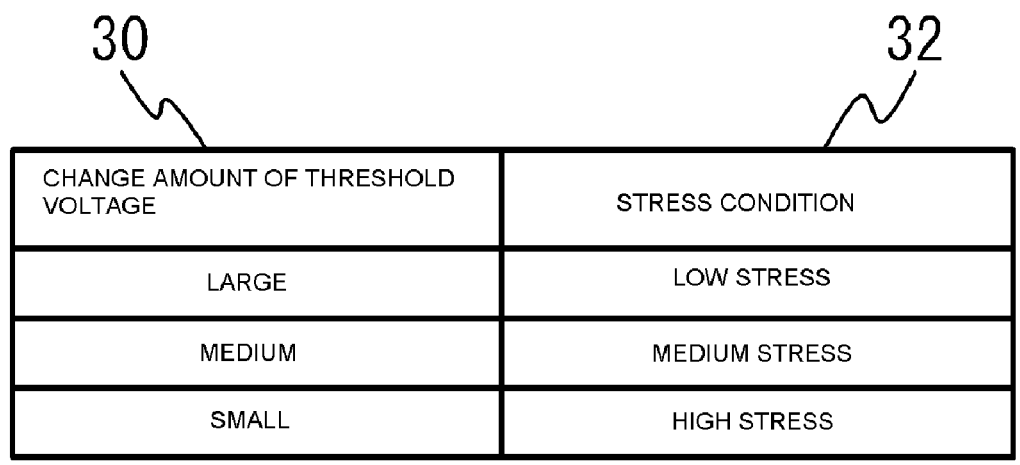
FIG. 6 is a table related to a semiconductor device in accordance with various embodiments of the invention.

FIG. 6 is a table showing each correlation between a change amount 30 of the threshold voltage of the reference region 14 caused by the stress, and a stress condition 32 upon data writing to the main data storage region 12 in accordance with various embodiments of the invention. Based on the table, the control unit 10 determines the stress condition upon data writing to the main data storage region 12. That is, when the change amount 30 of the threshold voltage is small (e.g., FIG. 5A) or less than a defined or predefined voltage value, the stress can be increased (e.g., by applying a higher voltage or applying voltage for a longer time) to reduce the time associated with data writing. Meanwhile, when the change amount 30 of the threshold voltage is large (e.g., FIG. 5B) or greater than a defined or predefined voltage value, the stress is reduced (e.g., by applying a lower voltage or applying voltage for a reduced time) to prevent the threshold voltage from greatly exceeding the predetermined value (Vtarget), thus suppressing variation in the threshold voltage for each memory cell.

As the data erasing operation is performed by the same unit in the main data storage region 12 and the reference region 14, the frequency of the data erasing operation becomes the same or similar in those regions. Accordingly, it may be assumed that the cell conditions (e.g., deterioration level of the cell owing to the stress due to the data erasing operation) of both regions are substantially the same. Then, the change amount of the threshold voltage with respect to the same stress may be the same or similar. For the above reason, the stress condition upon data writing to the main data storage region 12 may be set based on the amount of change of the threshold voltage upon data writing to the reference region 14. The stress condition is appropriately set, so that the variation in the threshold voltage can be suppressed while reducing the time associated with data writing to the main data storage region 12.

In one embodiment, the stress information (e.g., amount of change of the threshold voltage of the reference region 14 caused by the stress) can be measured for every data erasing operation for the purpose of determining the stress condition upon data writing. In an embodiment, the measurement of the stress information may be performed for every data writing operation to the main data storage region 12. The data erasing can be performed by the sector unit as described above, but is not limited to such. Meanwhile, the data writing can be performed by the unit smaller than the sector unit (for example, the memory cell unit or the word line unit). In the case where the data writing is performed by the word line unit, the number of the word lines is 256 per the single sector as shown in FIG. 2. This may increase the frequency of the data writing operation compared with that for the data erasing operation. As a result, the measurement of the stress information for every data writing operation may unnecessarily increase the time for measuring the stress information, resulting in a longer time associated with data writing. In one embodiment, the stress information is measured for every data erasing operation so as to reduce the data writing time.

Within an embodiment, the stress condition for the data writing operation can be determined based on the stress information when data is written to the reference region 14. The reference region 14 stores the reference information that is referred to when the data is read from the main data storage region 12, and the data can be first written subsequent to the data erasing operation. It is therefore suitable as a sample for measuring the stress information.

At block S13 of FIG. 3, the stress condition for the data writing operation to the reference region 14 can be adjusted based on the change amount of the threshold voltage of the reference region 14. However, this block may be omitted. Specifically, in one embodiment, the data writing operation to the reference region 14 may be performed under the same stress condition until the data writing operation is completed. When the stress condition is adjusted at block S13, the time associated with data writing to the reference region 14 can be reduced.

In an embodiment, the reference region 14 may be disposed to any location so long as the data erasing operation can be performed by the same unit as in the main data storage region 12. In one embodiment, it can be desirable to arrange the reference region 14 adjacent to the main data storage region 12 as shown in FIG. 1, for the convenience to perform a collective data erasing operation. In an embodiment, it can be desirable to provide the reference region 14 on the same word line as the one on which the main data storage region 12 is provided as shown in FIG. 2, for the convenience of the data reading operation from the main data storage region 12.

It is noted that in various embodiments, the auxiliary data storage region 16 may be of either volatile or non-volatile type storage so long as it is capable of storing the stress information and the stress condition for the data writing operation. It may be desirable that it is of the non-volatile type because the information can be retained after turning the power OFF. In one embodiment, it is possible to store the aforementioned stress information or the stress condition in a part of the main data storage region 12, instead of using the auxiliary data storage region 16. For example, the third data storage region can be formed as a part of the main data storage region 12 to save the space for the data storage region.

In various embodiments, the stress information is described as the change amount of the threshold voltage when data is written to the reference region 14. However, the stress information is not limited to the aforementioned information. Instead of using the stress information, the stress condition for the data writing operation to the main data storage region 12 that is set based on the stress information may be stored in the third data storage region.

It is pointed out that in various embodiments, the frequency of the stress applied to the second data storage region can be used as the stress information. The structure of the semiconductor device according to these embodiments can be similar to the semiconductor device 100 shown in FIG. 1, but is not limited to such.

Figure 7:
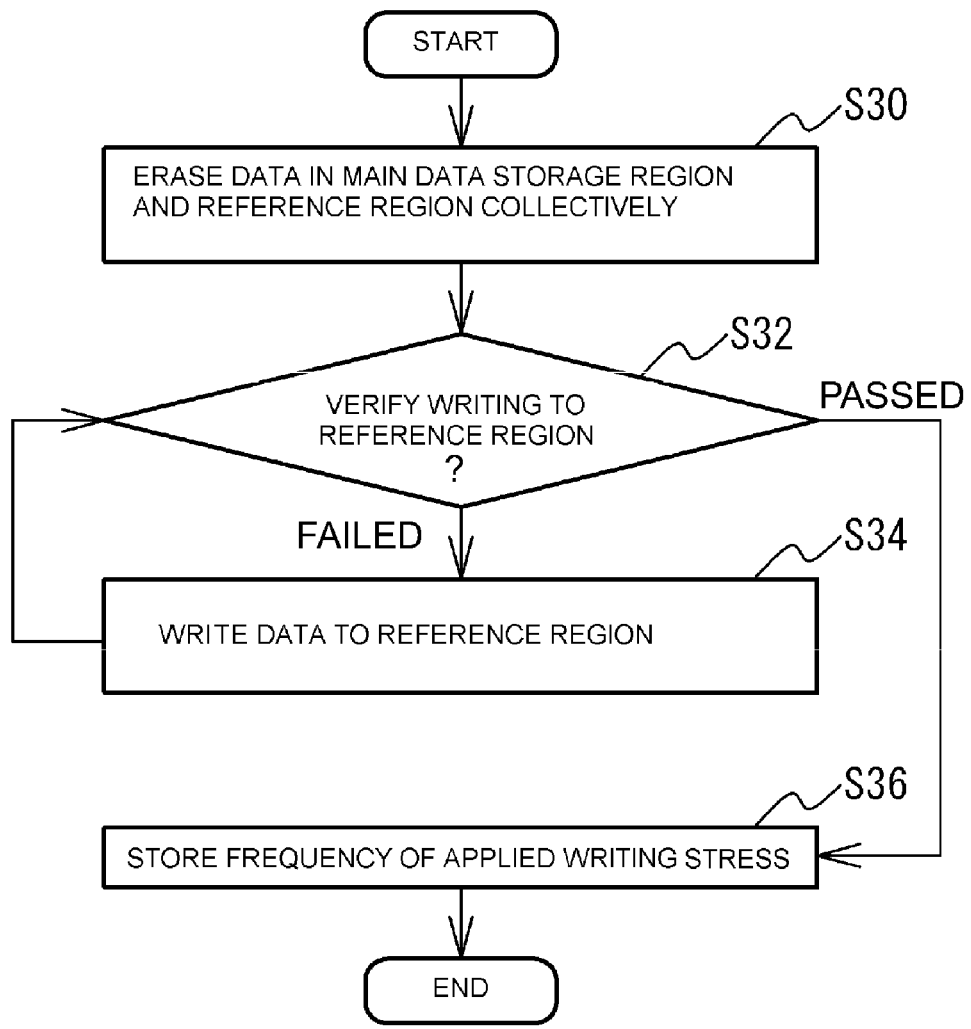
FIG. 7 is yet another flow diagram showing the operation of a semiconductor device in accordance with various embodiments of the invention.

FIG. 7 is a flow diagram of a method in accordance with various embodiments of the invention. The flow diagram includes exemplary processes of embodiments of the invention. Although specific operations are disclosed in FIG. 7, such operations are exemplary. That is, the method may not include all of the operations illustrated by FIG. 7. Also, the method may include various other operations and/or variations of the operations shown by FIG. 7. Likewise, the sequence of the operations of the method may be modified. Specifically, FIG. 7 is a flow diagram showing the routine for controlling the data erasing operation performed in the semiconductor device 100 in accordance with various embodiments of the invention. The control unit 10 erases the data stored in the main data storage region 12 and the reference region 14 at block S30, and verifies the threshold voltage of the reference region 14 at block S32.

When it fails the verification, the data writing operation to the reference region 14 at block S34 is repeatedly performed until it passes the verification at block S32. The aforementioned routine can be implemented in a manner similar to that described herein, but is not limited to such.

When the verification is passed at block S32, the process proceeds to block S36 where the control unit 10 stores the frequency of the stress applied until the data writing operation to the reference region 14 is completed in the auxiliary data storage region 16 as the stress information. The data erasing operation can end.

Figure 8:
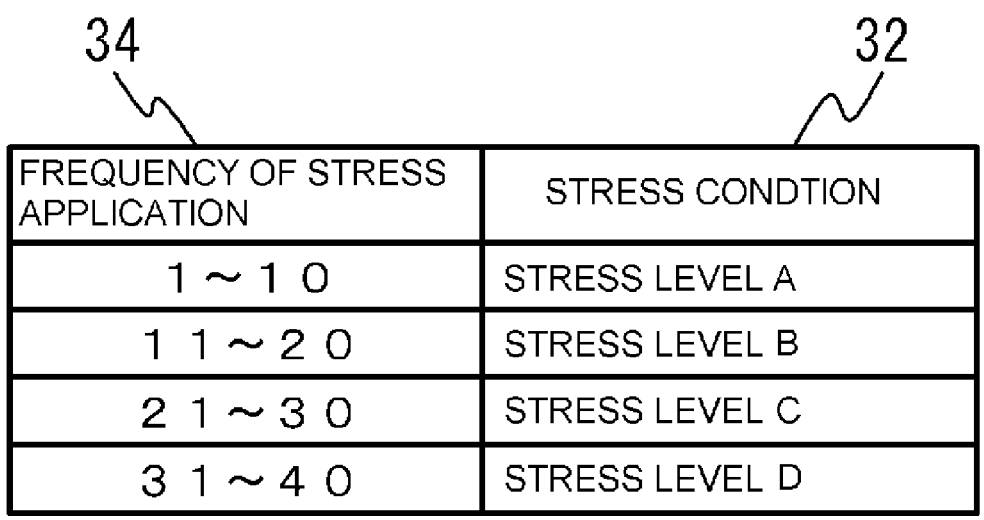
FIG. 8 is another table related to a semiconductor device in accordance with various embodiments of the invention.

The data writing operation performed in the semiconductor device 100 according to an embodiment will be described. The control routine for the data writing operation can be similar to that described with reference to FIG. 3, but the process for setting the stress condition can be different. Referring to FIG. 8, within one embodiment, the stress condition 32 can be set when data are erased, corresponding to the frequency of the stress 34 applied until the data writing operation to the reference region 14 has been completed. The control unit 10 reads the frequency of the stress stored in the auxiliary data storage region 16, and determines the stress condition 32 for the data writing operation to the main data storage region 12 with reference to the table shown in FIG. 8.

When the frequency of the applied stress 34 is low or less than a defined or predefined frequency value, the control unit 10 can set the stress condition 32 to decrease the stress level, because it is determined that the change amount of the threshold voltage of the memory cell for a single stress application is large or greater than a defined or predefined stress value. Meanwhile, when the frequency of the applied stress 34 is high or greater than a defined or predefined frequency value, the control unit 10 can set the stress condition 32 to raise the stress level, because it is determined that the change amount of the threshold voltage of the memory cell for a single stress application is small or less than a defined or predefined voltage value. In an embodiment, the stress level A of the stress condition 32 shown in FIG. 8 is the lowest (for example, a low voltage or less than a defined or predefined voltage value is applied for a short period or less than a defined or predefined time period), and the stress level D is the highest (for example, a high voltage or greater than a defined or predefined voltage value is applied for a long time or greater than a defined or predefined time period). In a manner similar to that described herein, the variation in the threshold voltage of the memory cell can be suppressed while reducing the data writing time.

In one embodiment described herein, the change in the threshold voltage of the reference region 14 caused by the stress can be measured when data is written to the reference region 14. On the other hand, in another embodiment, the frequency of the stress applied to the reference region 14 may only be counted, thus allowing easy measurement of the stress information. In order to accurately measure the stress information, it can be desirable to measure the amount of change in the threshold voltage with respect to the stress as previously described herein, in accordance with an embodiment.

According to an embodiment of the invention, a semiconductor device can include a first data storage region including a non-volatile main data storage region. Additionally, the semiconductor device can include a second data storage region including a non-volatile reference region wherein an erasing operation and a writing operation are performed on both the first data storage region and the second data storage region. Moreover, the semiconductor device can also include a control unit coupled to the first and second data storage regions which determines a stress condition corresponding to the first data storage region based on a stress information related to the second data storage region.

It is noted that in one embodiment, the second data storage region may store reference information that is referred to when data is read from the first data storage region. According to this structure, the reference information is first written subsequent to the data erasing operation, so that the stress condition upon the data writing to the first data storage region can be set based on the stress information when data is written to the second data storage region.

Note that in an embodiment, the stress information may include a change of a threshold voltage of the second data storage region caused by the stress applied to the second data storage region. This structure allows the stress condition when data is written to the first data storage region to be set with higher accuracy.

It is pointed out that in one embodiment, the control unit may control such that the stress upon the data writing operation to the first data storage region is decreased when the change amount of the threshold voltage is large or greater than a defined or predefined voltage value, and control such that the stress upon the data writing operation to the first data storage region is increased when the change amount of the threshold voltage is small or less than a defined or predefined voltage value. This structure can suppress variation in the threshold voltage while reducing the data writing time.

It is noted that in an embodiment, when the data writing fails a verification with respect to the data writing operation to the second data storage region, the control unit may change, based on the change amount of the threshold voltage of the second data storage region, a condition of the stress applied to the second data storage region and perform the data writing operation again. This structure can reduce the time associated with data writing to the second data storage region.

Note that in one embodiment, the stress information may include a frequency of the stress applied to the second data storage region until the data writing operation to the second data storage region is completed. This structure can measure the stress information easily compared with the measurement of the change amount of the threshold voltage.

It is pointed out that in an embodiment, when the data is written to the first data storage region, if the frequency of the stress applied is low or less than a defined or predefined frequency value to the second data storage region until the data writing operation to the second data storage region is completed, the control unit may control such that the stress upon the data writing operation to the first data storage region is decreased, and if the frequency of the stress applied is high or greater than a defined or predefined frequency value to the second data storage region until the data writing operation to the second data storage region is completed, the control unit may control such that the stress upon the data writing operation to the first data storage region is increased. This structure can suppress the variation in the threshold voltage while reducing the data writing time.

It is noted that in one embodiment, the stress condition may be set as at least one of the level of the voltage applied to the first data storage region and the length of time for which the voltage is applied.

Note that in an embodiment, the above-described structure may further include a third data storage region which stores at least one of the stress information and the stress condition.

In one embodiment, the first and the second data storage regions may be arranged on the same word line.

According to an embodiment of the invention, a method for controlling a semiconductor device which includes a first data storage region including a main data storage region and a second data storage region including a reference region. The method can include erasing data stored in the first and the second data storage regions at substantially the same time. In addition, the method can include writing data to the second data storage region. Also, the method can include determining a stress condition corresponding to the first data storage region based on a stress information related to the second data storage region.

It is noted that in one embodiment, the operation of writing data to the second data storage region may further include the operation of applying the stress for data writing to the second data storage region, and the operation of measuring the change of the threshold voltage of the second data storage region caused by the stress. The operation of determining the stress condition based on the stress information may further include the operation of setting the stress to be small or less than a defined or predefined stress value upon the data writing operation to the first data storage region when the change amount of the threshold voltage is large or greater than a defined or predefined voltage value, and the operation of setting the stress to be large or greater than a defined or predefined stress value upon the data writing operation to the first data storage region when the change amount of the threshold voltage is small or less than a defined or predefined voltage value.

Note that in an embodiment, the operation of writing data to the second data storage region may further include the operation of applying the stress for data writing to the second data storage region, and the operation of counting the frequency of the stress applied to the second data storage region until the data writing operation to the second data storage region is completed. The operation of determining the stress condition based on the stress information may further include the operation of setting the stress to be small or less than a defined or predefined stress value upon the data writing operation to the first data storage region when the frequency of the stress application is low or less than a defined or predefined frequency value, and the operation of setting the stress to be large or greater than a defined or predefined stress value upon the data writing operation to the first data storage region when the frequency of the stress application is high or greater than a defined or predefined frequency value.

In one embodiment, after erasing the data stored in the first and the second data storage regions, the control unit determines the stress condition relating to the stress upon the data writing operation to the first data storage region, based on the stress information relating to the stress upon the data writing operation to the second data storage region. In this manner, the stress information is measured for every data erasing operation, so that the data writing time can be reduced. In the first and the second data storage regions, the data erasing operation can be performed by the same unit so the stress condition upon the data writing operation to the first data storage region can be appropriately set based on the stress information upon the data writing operation to the second data storage region.

In an embodiment, a flash memory can include a first data storage region that includes a non-volatile main data storage region. The flash memory can include a second data storage region including a non-volatile reference region wherein an erasing operation and a writing operation are performed on both the first data storage region and the second data storage region. A control unit of the flash memory can be coupled to the first and second data storage regions which determines a stress condition corresponding to the first data storage region based on a stress information related to the second data storage region. The stress information can include a frequency of the stress applied to the second data storage region.

It is noted that in one embodiment, the second data storage region can store a reference information that is referred to when data is read from the first data storage region. In an embodiment, the stress information comprises a change of threshold voltage of the second data storage region caused by stress applied to the second data storage region.

In one embodiment, the control unit decreases the stress of the writing operation to the first data storage region when the change of threshold voltage is greater than a defined voltage value. Additionally, the control unit increases the stress of the writing operation to the first data storage region when the change of threshold value is less than a defined voltage value. In an embodiment, the first and the second data storage regions are coupled to a word line.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention can be construed according to the Claims and their equivalents.

What is claimed is:

1. A semiconductor device comprising:
    a first data storage region comprising a non-volatile main data storage region;
    a second data storage region comprising a non-volatile reference region wherein an erasing operation and a writing operation are performed on both the first data storage region and the second data storage region, wherein the non-volatile reference region comprises a first memory cell and a second memory cell that are both connected to a word line, the first memory cell stores a first logic value and has a first threshold voltage setting, the second memory cell stores a second logic value and has a second threshold voltage setting that is less than the first threshold voltage setting, a reference voltage value is determined between the first and second threshold voltage settings; and
    a control unit coupled to the first and second data storage regions, wherein every time the control unit erases collectively data stored in the first and second data storage regions, the control unit determines a stress information related to the second data storage region by writing data to the second data storage region, next the control unit determines a stress condition corresponding to the first data storage region based on the stress information, and next the control unit uses the stress condition to verify a threshold voltage of the first data storage region.

2. The semiconductor device of claim 1, wherein the second data storage region stores a reference information that is referred to when data is read from the first data storage region.

3. The semiconductor device of claim 1, wherein the stress information comprises a change of threshold voltage of the second data storage region caused by stress applied to the second data storage region.

4. The semiconductor device of claim 3, wherein the control unit decreases the stress of the writing operation to the first data storage region when the change of threshold voltage is greater than a defined voltage value.

5. The semiconductor device of claim 3, wherein the control unit increases the stress of the writing operation to the first data storage region when the change of threshold value is less than a defined voltage value.

6. The semiconductor device of claim 1, wherein the stress information comprises a frequency of stress applied to the second data storage region.

7. The semiconductor device of claim 6, wherein the control unit decreases the stress of the writing operation on the first data storage region when the frequency of stress applied to the second data storage region is less than a defined frequency value, and the control unit increases the stress of the writing operation on the first data storage region when the frequency of stress applied to the second data storage region is greater than the defined frequency value.

8. The semiconductor device of claim 1, further comprising a volatile data storage region coupled to the control unit which stores the stress information.

9. The semiconductor device of claim 1, wherein the first and the second data storage regions are both connected to the word line.

10. A method for controlling a semiconductor device which comprises a first data storage region comprising a non-volatile main data storage region and a second data storage region comprising a non-volatile reference region, the method comprising:
    determining a reference voltage between a first threshold voltage setting and a second threshold voltage setting, wherein the non-volatile reference region comprises a first memory cell and a second memory cell that are both connected to a word line, the first memory cell stores a first logic value and has the first threshold voltage setting, the second memory cell stores a second logic value and has the second threshold voltage setting that is less than the first threshold voltage setting;
    erasing collectively data stored in the first and the second data storage regions;
    every time after the erasing, determining a stress information related to the second data storage region by writing data to the second data storage region;
    after the determining the stress information, determining a stress condition corresponding to the first data storage region based on the stress information related to the second data storage region; and
    after the determining the stress condition, using the stress condition to verify a threshold voltage of the first data storage region.

11. The method of claim 10, wherein said semiconductor device comprises flash memory.

12. The method of claim 10, further comprising after the determining the stress information, storing the stress information with a volatile data storage region.

13. The method of claim 10, further comprising measuring an amount of change in a threshold voltage of the second data storage region.

14. The method of claim 13, further comprising adjusting a writing stress condition of the second data storage region.

15. The method of claim 13, further comprising storing as the stress information the amount of change in the threshold voltage of the second data storage region.

16. A flash memory comprising:
- a first data storage region comprising a non-volatile main data storage region;
- a second data storage region comprising a non-volatile reference region wherein an erasing operation and a writing operation are performed on both the first data storage region and the second data storage region, wherein the non-volatile reference region comprises a first memory cell and a second memory cell that are both connected to a word line, the first memory cell stores a first logic value and has a first threshold voltage setting, the second memory cell stores a second logic value and has a second threshold voltage setting that is less than the first threshold voltage setting, a reference voltage value is determined between the first and second threshold voltage settings; and
- a control unit coupled to the first and second data storage regions, wherein every time the control unit erases collectively data stored in the first and second data storage regions, the control unit determines a stress information related to the second data storage region by writing data to the second data storage region, next the control unit determines a stress condition corresponding to the first data storage region based on the stress information, and next the control unit uses the stress condition to verify a threshold voltage of the first data storage region, wherein the stress information comprises a frequency of the stress applied to the second data storage region.

17. The flash memory of claim 16, wherein the second data storage region stores a reference information that is referred to when data is read from the first data storage region.

18. The flash memory of claim 16, wherein the stress information comprises a change of threshold voltage of the second data storage region caused by stress applied to the second data storage region.

19. The flash memory of claim 18, wherein the control unit decreases the stress of the writing operation to the first data storage region when the change of threshold voltage is greater than a defined voltage value, and the control unit increases the stress of the writing operation to the first data storage region when the change of threshold value is less than the defined voltage value.

20. The flash memory of claim 18, wherein the first and the second data storage regions are both connected to the word line.

\* \* \* \* \*